(12) United States Patent
Hayashi et al.

(10) Patent No.: US 6,493,305 B1
(45) Date of Patent: Dec. 10, 2002

(54) PULSE WIDTH CONTROL CIRCUIT

(75) Inventors: Koji Hayashi, Hashima (JP); Toru Akiyama, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/273,617

(22) Filed: Mar. 22, 1999

(30) Foreign Application Priority Data

Mar. 26, 1998 (JP) .......................................... 10-078789
Mar. 26, 1998 (JP) .......................................... 10-078790

(51) Int. Cl.$^7$ .............................................. G11B 5/09
(52) U.S. Cl. ................................ 369/59.12; 369/53.34; 369/124.14; 369/59.2; 369/60.01
(58) Field of Search ........................... 369/59.12, 53.34, 369/59.2, 13.02, 59.11, 116, 13.24, 124.14, 60.01; 365/194, 233.5; 327/269, 276, 10, 16; 713/501; 331/24

(56) References Cited

U.S. PATENT DOCUMENTS

| | | | |
|---|---|---|---|
| 4,956,720 A | * | 9/1990 | Tomisawa .................... 369/59.2 |
| 5,163,036 A | * | 11/1992 | Yokogawa ............... 369/124.14 |
| 5,327,411 A | * | 7/1994 | Iwasa et al. .................. 369/116 |
| 5,347,505 A | * | 9/1994 | Moritsugu et al. ........ 369/59.12 |
| 5,469,422 A | * | 11/1995 | Sohmuta ....................... 369/116 |
| 5,566,129 A | * | 10/1996 | Nakashima et al. ............ 327/10 |
| 5,604,775 A | * | 2/1997 | Saitoh et al. ................... 331/25 |
| 5,771,216 A | * | 6/1998 | Tatsuzawa et al. ......... 369/13.02 |
| 5,923,613 A | * | 7/1999 | Tien et al. .................... 327/261 |
| 5,986,949 A | * | 11/1999 | Toda ............................ 327/269 |
| 6,044,055 A | * | 3/2000 | Hara ............................ 369/116 |

* cited by examiner

Primary Examiner—William Korzuch
Assistant Examiner—Kim-Kwok Chu
(74) Attorney, Agent, or Firm—Fish & Richardson P.C.

(57) ABSTRACT

A pulse width control circuit is used to control the pulse with of a modulation signal to be written to a recording medium, such as a CD-R. The circuit controls both the leading and trailing edges of the modulation signal. The circuit includes a first delay circuit including multiple series connected first inverters for delaying the modulation signal and generating multiple first delay signals. The first delay signals are input to a first selector, which selects one of the first delay signals. A first logic circuit receives the selected first delay signal and the modulation signal and performs a first logic operation. The output of the first logic circuit is input to a second delay circuit, which includes multiple series connected second inverters for delaying the first logic circuit output signal, and generating multiple second delay signals. A second selector selects one of the plurality of delayed logic signals in accordance with the second selection signal. A second logic circuit receives the selected second delay signal and the first logic circuit output signal and performs a second logical operation, thereby generating a pulse width controlled modulation signal. The first delay circuit and first selector control the leading edge of the modulation signal, and the second delay circuit and the second selector control the trailing edge of the modulation signal.

18 Claims, 11 Drawing Sheets

Fig.4

| Media | Speed | Delay time Tdf (T/16) of rising edge | Delay time Tdb (T/16) of falling edge |
|---|---|---|---|
| A | 1x | 1 | 6 |
|   | 2x | 1 | 6 |
|   | 4x | 2 | 7 |
|   | 8x | 2 | 7 |
| B | 1x | 2 | 7 |
|   | 2x | 2 | 7 |
|   | 4x | 3 | 8 |
|   | 8x | 3 | 8 |
| C | ⋮ | ⋮ | ⋮ |

Fig.5
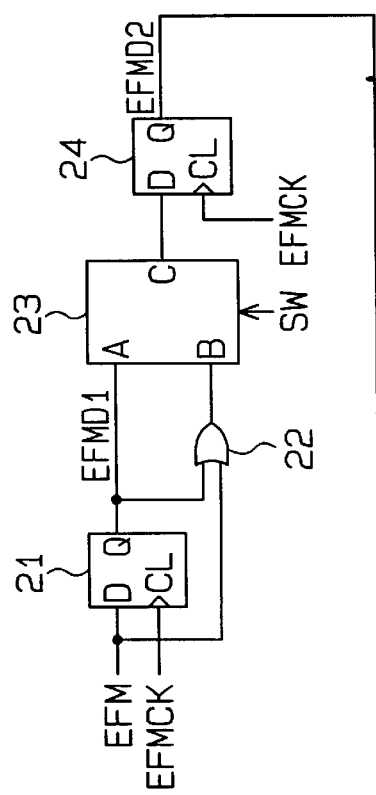
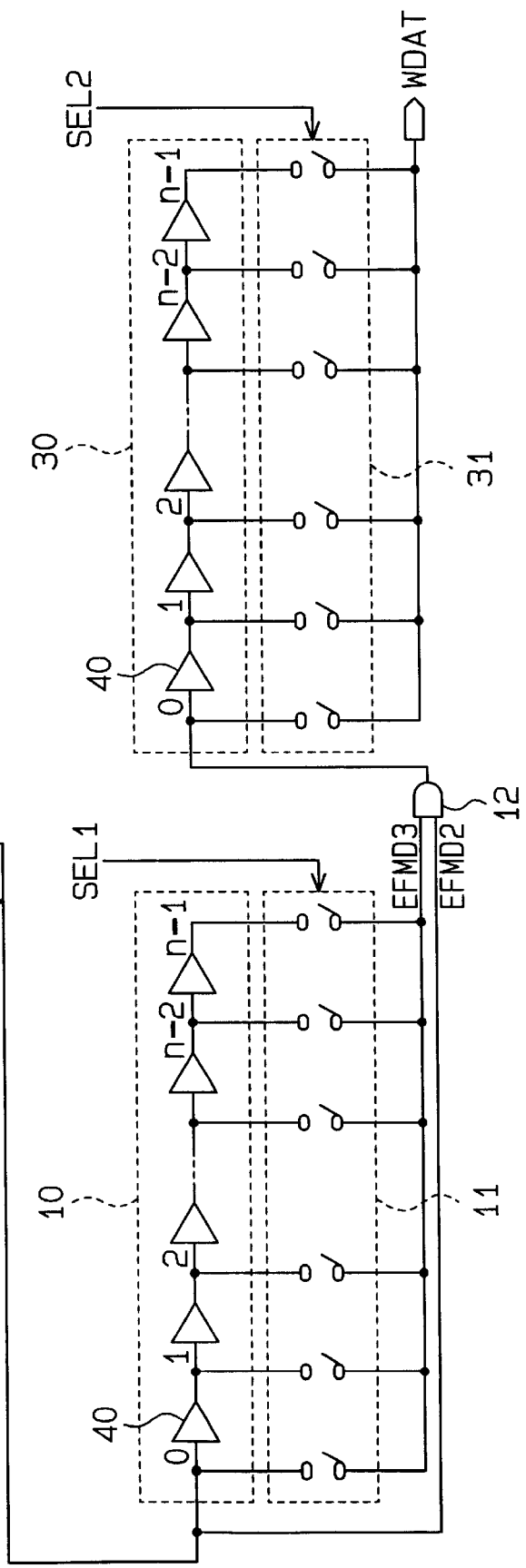

PULSE WIDTH CONTROL CIRCUIT

BACKGROUND OF THE INVENTION

The present invention generally relates to a pulse control circuit, and, more particularly, to a pulse width control circuit including a delay circuit having a plurality of delay elements. The pulse width control circuit is suitable for use in a disk recording control circuit where the recording timing of recording marks is adjustable.

Optical disk devices and magneto-optical disk devices that can reproduce and write data are known. Data is written on a recording medium by recording a recording mark corresponding to a data modulation signal using a laser device.

For example, in a CD-R (compact disc-recordable), an EFM (Eight to Fourteen Modulation) encoder converts write data into an EFM signal, and the laser device records a recording mark corresponding to the EFM signal on the disk. However, the recording status varies in accordance with the type of recording medium and the rotational speed of the disk. In this case, a desired recording mark cannot be recorded simply by supplying the EFM signal to the laser device. As an experiment for recording the desired recording mark, delaying the rising (leading) edge and falling (trailing) edge of the EFM signal has been performed. For example, to delay the EFM signal, a delay circuit including a plurality of logic circuits such as D flip-flops that operate in synchronism with a clock signal is used.

The EFM signal is synchronized with a reference signal called an EFM clock signal and has a pulse width of three to eleven cycles of the EFM clock signal. Accordingly, the clock signal applied to the D flip-flop of the delay circuit should be faster than the EFM clock signal. For example, when the delay circuit has sixteen stage resolution, a clock signal having sixteen times the speed of the EFM clock signal is required.

Thus, the required frequency of the EFM clock signal is relatively high. For example, the frequency of the EFM clock signal is "17.28 MHZ" for 4× speed and "34.56 MHZ" for 8× speed. Accordingly, a clock signal of "276.48 MHZ" should be applied to the D flip-flop for 4× speed and a clock signal of "552.96 MHZ" should be applied to it for 8× speed. Today, it is impossible to supply such a high-speed clock signal, and it is also exceedingly difficult to obtain a logic circuit that stably operates in synchronism with the high-speed clock signal.

Further, the delay circuit is sensitive to external effects, such as power fluctuations and temperature changes. Accordingly, when a very short pulse width is desired, it is difficult to control the delay circuit with high accuracy.

It is an object of the present invention to provide a pulse width control circuit which generates a pulse signal without using a high-speed clock signal.

SUMMARY OF THE INVENTION

In a first aspect, the present invention provides a pulse width control circuit including a first delay circuit which includes a plurality of first delay elements for delaying a pulse signal and generating a plurality of first delay pulse signals. A first selector selects one of the plurality of first delay pulse signals. A first logic circuit receives the selected first delay pulse signal and the pulse signal and generates a first logic output signal. A second delay circuit includes a plurality of second delay elements for delaying the first logic output signal and generating a plurality of delay logic signals. A second selector selects one of the plurality of delay logic signals. A second logic circuit receives the selected delay logic signal and the first logic output signal and generates a second logic output signal. The first and second logic circuits include a logic AND circuit and a logic OR circuit.

In a second aspect, the present invention provides a disk recording control circuit including a pulse width control circuit for receiving a pulse modulation signal and generating a pulse width controlled modulation signal in accordance with first and second selection signals related to a media type and/or a rotational speed of a recording medium. The pulse width control circuit includes a first delay circuit which includes a plurality of first delay elements for delaying the pulse modulation signal and generating a plurality of delayed pulse modulation signals. A first selector selects one of the plurality of delayed pulse modulation signals in accordance with the first selection signal. A first logic circuit receives the selected delayed pulse modulation signal and the pulse modulation signal and generates a logic output signal. A second delay circuit includes a plurality of second delay elements for delaying the logic output signal and generating a plurality of delayed logic signals. A second selector selects one of the plurality of delayed logic signals in accordance with the second selection signal. A second logic circuit receives the selected delayed logic signal and the logic output signal and generates the pulse width controlled modulation signal. The first and second logic circuits include a logic AND circuit and a logic OR circuit.

In a third aspect, the present invention provides a pulse width control circuit including a synchronous circuit for receiving a pulse signal and generating a delayed pulse signal which is synchronized with a reference clock signal and is delayed by a predetermined period. A first logic circuit receives the delayed pulse signal and the pulse signal and generates a first logic operation pulse signal. A selection circuit receives the delayed pulse signal and the first logic operation pulse signal and selects one of the delayed pulse signal and the first logic operation pulse signal in accordance with information indicating a decrease or increase of the pulse width. A first delay circuit includes a plurality of first delay elements for delaying the selected pulse signal and generating a plurality of first delayed pulse signals. A first selector selects one of the plurality of first delayed pulse signals. A second logic circuit receives the selected first delayed pulse signal and the selected one of delayed pulse signal and the first logic operation pulse signal from the selection circuit and generates a second logic operation pulse signal. A second delay circuit includes a plurality of second delay elements for delaying the second logic operation pulse signal and generating a plurality of delayed logic signals. A second selector selects one of the plurality of delayed logic signals and generates a pulse width controlled pulse signal.

In a fourth aspect, the present invention provides a pulse width control circuit including a synchronous circuit for receiving a pulse signal and generating a delayed pulse signal which is synchronized with a reference clock signal and is delayed by a predetermined period. A first logic circuit receives the delayed pulse signal and the pulse signal and generates a logic operation pulse signal. A selection circuit receives the delayed pulse signal and the logic operation pulse signal and selects one of the delayed pulse signal and the logic operation pulse signal in accordance with information indicating a decrease or increase of the pulse width. A first delay circuit includes a plurality of first delay elements for delaying the selected pulse signal and generating a plurality of first delayed pulse signals. A first selector selects one of the plurality of first delayed pulse signals. A second delay circuit includes a plurality of second delay elements for delaying the selected first delayed pulse signal and generating a plurality of second delayed pulse signals. A second selector selects one of the plurality of second delayed pulse signals. A second logic circuit receives the selected second delayed pulse signal and the selected one of the delayed pulse signal and the logic operation pulse signal from the selection circuit and generates a pulse width controlled pulse signal.

In a fifth aspect, the present invention provides a disk recording control circuit including a pulse width control circuit for receiving a pulse modulation signal and generating a pulse width controlled modulation signal in accordance with first and second selection signals related to a media type and/or a rotational speed of a recording medium. The pulse width control circuit includes a synchronous circuit for receiving the pulse modulation signal and generating a delayed pulse modulation signal which is synchronized with a reference clock signal and is delayed by a predetermined period. A first logic circuit receives the delayed pulse modulation signal and the pulse modulation signal and generates a first logic operation pulse modulation signal. A selection circuit receives the delayed pulse modulation signal and the first logic operation pulse modulation signal and selects one of the delayed pulse modulation signal and the first logic operation pulse modulation signal in accordance with information indicating a decrease or increase of the pulse width. A first delay circuit includes a plurality of first delay elements for delaying the selected pulse modulation signal and generating a plurality of first delayed pulse modulation signals. A first selector selects one of the plurality of first delayed pulse modulation signals in accordance with a first selection signal. A second logic circuit receives the selected first delayed pulse modulation signal and the selected one of the delayed pulse modulation signal and the first logic operation pulse modulation signal from the selection circuit and generates a second logic operation pulse modulation signal. A second delay circuit includes a plurality of second delay elements for delaying the second logic operation pulse modulation signal and generating a plurality of delayed logic signals. A second selector selects one of the plurality of delayed logic signals in accordance with a second selection signal and generates the pulse width controlled pulse modulation signal.

In a sixth aspect, the present invention provides a disk recording control circuit including a pulse width control circuit for receiving a pulse modulation signal and generating a pulse width controlled modulation signal in accordance with first and second selection signals related to a media type and/or a rotational speed of a recording medium. The pulse width control circuit includes a synchronous circuit for receiving the pulse modulation signal and generating a delayed pulse modulation signal which is synchronized with a reference clock signal and is delayed by a predetermined period. A first logic circuit receives the delayed pulse modulation signal and the pulse modulation signal and generates a logic operation pulse modulation signal. A selection circuit receives the delayed pulse modulation signal and the logic operation pulse modulation signal and selects one of the delayed pulse modulation signal and the logic operation pulse modulation signal in accordance with information indicating a decrease or increase of the pulse width. A first delay circuit includes a plurality of first delay elements for delaying the selected pulse modulation signal and generating a plurality of first delayed pulse modulation signals. A first selector selects one of the plurality of first delayed pulse modulation signals. A second delay circuit includes a plurality of second delay elements for delaying the selected first delayed pulse modulation signal and generating a plurality of second delayed pulse modulation signals. A second selector selects one of the plurality of second delayed pulse modulation signals. A second logic circuit receives the selected second delayed pulse modulation signal and the selected one of the delayed pulse modulation signal and the logic operation pulse modulation signal from the selection circuit and generates the pulse width controlled pulse modulation signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4 is a diagram showing data stored in a table of the disk recording control circuit of FIG. 3;

FIG. 5 is a schematic block diagram of a pulse width control circuit according to a second embodiment of the present invention;

DETAILED DESCRIPTION OF THE PREFERRED EMBODIMENTS

Figure 1:
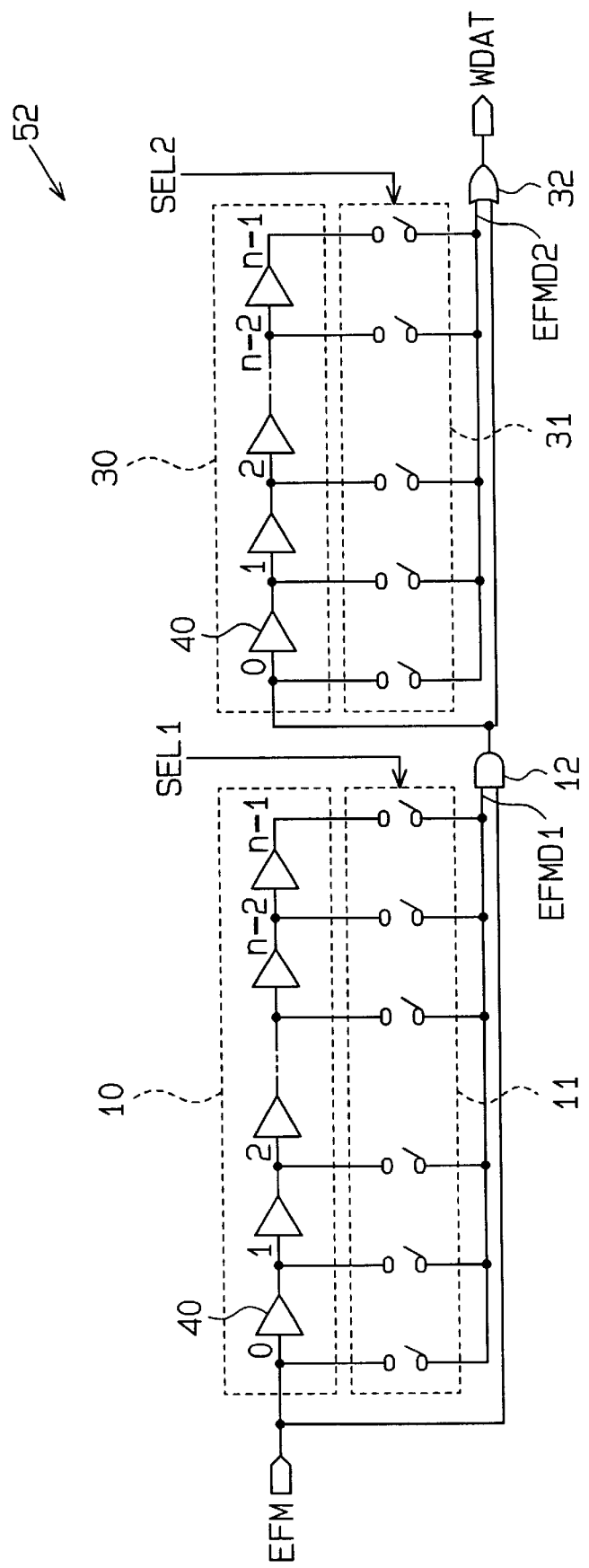
FIG. 1 is a schematic block diagram of a pulse width control circuit according to a first embodiment of the present invention.

In the drawings, like numerals are used for like elements throughout.
(First Embodiment)

FIG. 1 is a schematic block diagram of a pulse width control circuit 52 according to a first embodiment of the present invention. The pulse width control circuit 52 includes first and second delay circuits 10 and 30 that independently delay the rising (leading) edge and the falling (trailing) edge of an EFM signal (input signal). The first delay circuit 10 includes a plurality of series connected delay elements 40 which generate a plurality of first delay signals. The second delay circuit 30 also includes a plurality of series connected delay elements 40 which generate a plurality of second delay signals. Each delay element 40 is preferably an inverter.

A first selector 11 is connected to the plurality of delay elements 40 of the first delay circuit 10 and selects one of the plurality of first delay signals in accordance with a first selection signal SEL1. A second selector 31 is connected to the plurality of delay elements 40 of the second delay circuit 30 and selects one of the plurality of second delay signals in accordance with a second selection signal SEL2. The pulse width control circuit 52 further includes an AND gate (logic AND circuit) 12 and an OR gate (logic OR circuit) 32. The AND gate 12 has a first input terminal receiving the selected first delay signal from the first selector 11, a second input terminal receiving the EFM input signal, and an output terminal outputting an AND output signal. The OR gate 32 has a first input terminal receiving the selected second delay signal from the second selector 31, a second input terminal receiving the AND output signal, and an output terminal that outputs an OR output signal.

Each of the first and second delay circuits 10 and 30 includes sixteen series connected delay elements 40, and a delay time dt of each single delay element 40 is set to ¹/₁₆ of the cycle T of an EFM clock signal EFMCK (reference clock signal).

Figure 2:
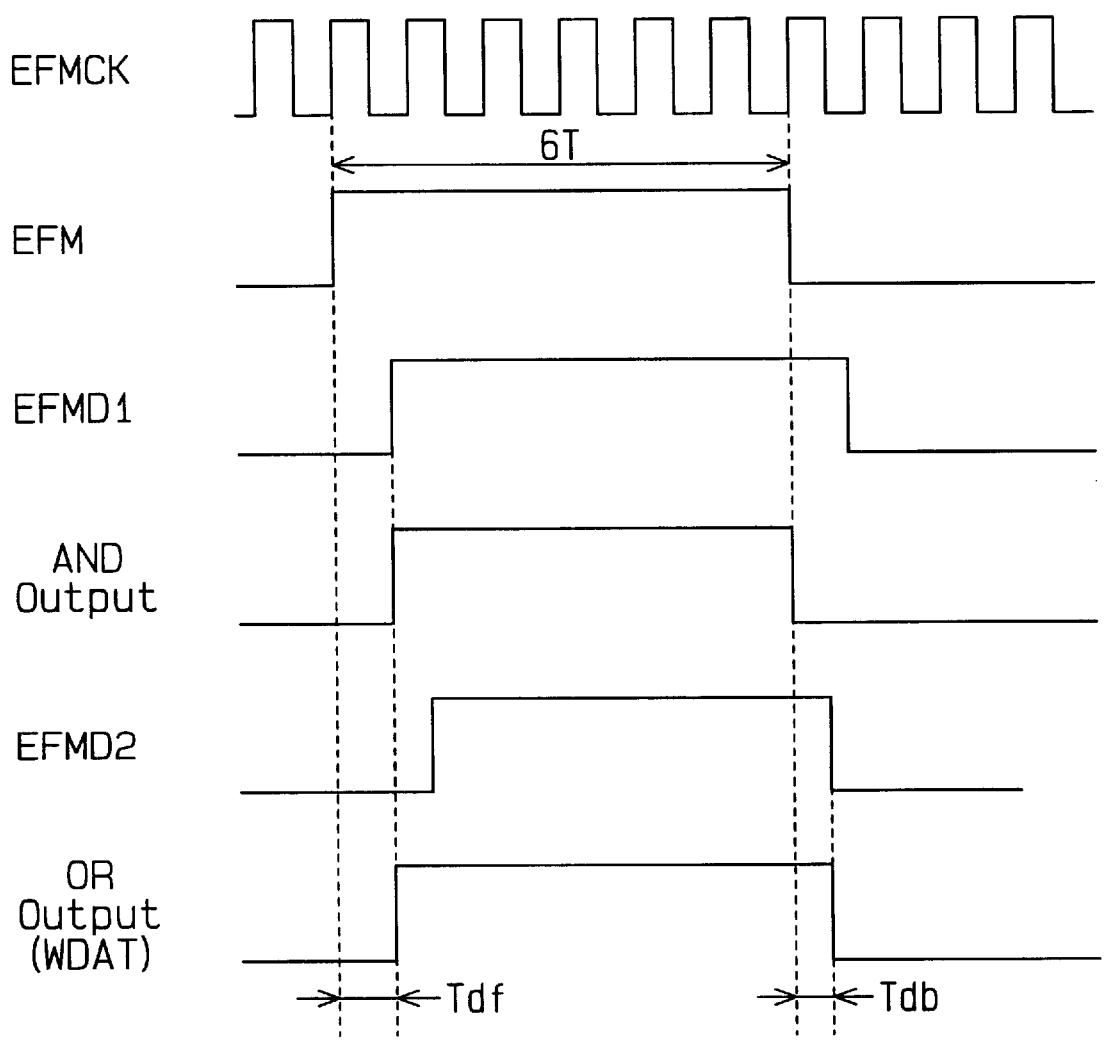
FIG. 2 is a timing chart describing the operation of the pulse control circuit of FIG. 1.

As shown in FIG. 2, the EFM signal is high for six cycles (6T) of the EFM clock signal EFMCK (reference clock signal) and is supplied to the first delay circuit 10. Each delay element 40 of the first delay circuit 10 delays the EFM signal by T/16. The first selector 11 selects a first delay signal EFMD1 of the nth delay element 40 specified by the first selection signal SEL1 and supplies the selected first delay signal EFMD1 to the AND gate 12. For example, when the 10th delay element 40 is selected by the first selection signal SEL1, a delay time Tdf at the rising edge of the EFM signal is 10×T/16. The AND gate 12 receives the first delay signal EFMD1 and the EFM signal and supplies an AND output signal of the first delay signal EFMD1 and the EFM signal to the second delay circuit 30.

Each delay element 40 of the second delay circuit 30 delays the AND output signal of the AND gate 12 by T/16. The second selector 31 selects a second delay signal EFMD2 of the nth delay element 40 specified by the second selection signal SEL2 and supplies the selected second delay signal EFMD2 to the OR gate 32. For example, when the 8th delay element 40 is selected by the second selection signal SEL2, a delay time Tdb at the falling edge of the EFM signal is 8×T/16. The OR gate 32 receives the AND output signal and the second delay signal EFMD2 and outputs an OR output signal of the AND output signal and the second delay signal EFMD2 as a pulse width controlled EFM signal WDAT. That is, the pulse width controlled EFM signal WDAT is generated by delaying the rising edge of the EFM signal by the delay time Tdf (10×T/16) and by delaying the falling edge of the EFM signal by the delay time Tdb (8×T/16). Accordingly, the pulse width of the pulse width controlled EFM signal WDAT is shorter by 2T/16 (10×T/16−8×T/16) than that of the EFM signal.

In the first embodiment, the delay times Tdf and Tdb of the rising and the falling edges of the EFM signal are independently set in accordance with the first and second selection signals SEL1 and SEL2, respectively. Alternatively, the second delay circuit 30 may receive the EFM signal, the OR output signal of the OR gate 32 may be supplied to the first delay circuit 10, and finally the pulse width controlled EFM signal WDAT may be output from the AND gate 12. In the alternative example, the same pulse width controlled EFM signal WDAT as the first embodiment is obtained. Further, a comparator may be used as each delay element 40 instead of an inverter.

Figure 3:
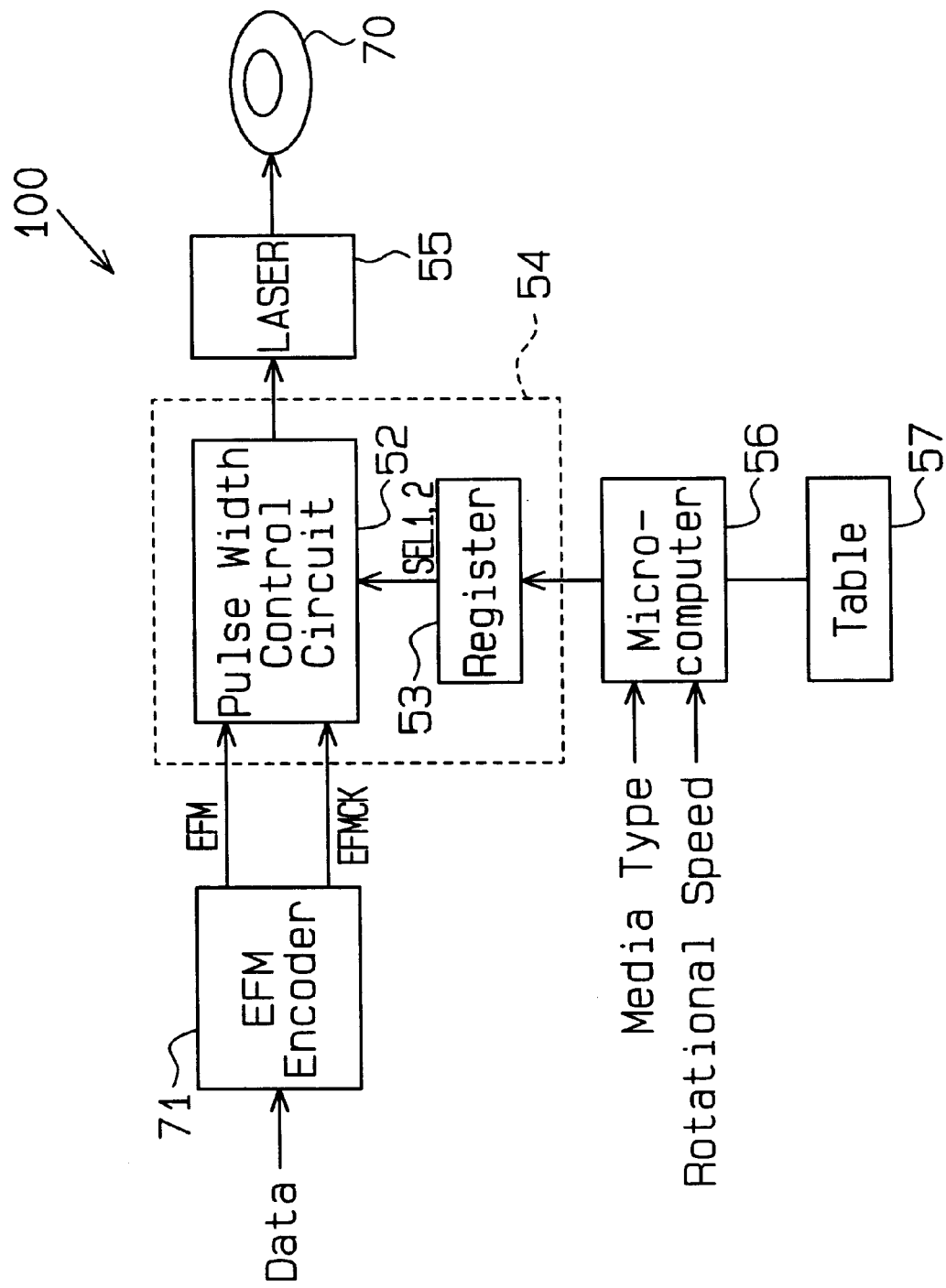
FIG. 3 is a schematic block diagram of a disk recording control circuit including the pulse width control circuit of FIG. 1.

FIG. 3 is a schematic block diagram of a CD-R disk recording apparatus 100 including the pulse width control circuit 52. The CD-R apparatus 100 includes an EFM encoder 71, a disk recording control circuit 54, a laser device 55, a microcomputer 56, and a software table 57. The disk recording control circuit 54 includes the pulse width control circuit 52 and a register 53.

The EFM encoder 71 modulates a write data signal to an EFM signal and generates an EFM clock signal EFMCK. The pulse width control circuit 52 receives the EFM signal and the EFM clock signal EFMCK and supplies a pulse width controlled EFM signal WDAT to the laser device 55. The laser device 55 includes a laser pickup (not shown) which records a recording mark corresponding to the pulse width controlled EFM signal WDAT on a disk 70.

The microcomputer 56 receives information indicating the media type and the rotational speed of the disk 70 from an external device (not shown) and controls the disk recording control unit 54 based on the information. The delay times Tdf and Tdb of the rising and falling edges are preset in accordance with the media type and rotational speed and stored in the table 57 connected to the microcomputer 56, as shown in FIG. 4. Of course, it will be understood that these are not fixed numbers, and other numbers may be stored in the table 57. The delay times Tdf and Tdb of the rising and falling edges are used as the first and second selection signals SEL1 and SEL2.

The microcomputer 56 receives the specified media type and rotational speed, reads values of the delay times of the corresponding rising and falling edges from the table 57, and sets the values in the register 53. The pulse width control circuit 52 receives the values from the register 53 as the first and second selection signals SEL1 and SEL2. The circuit 52 delays the rising edge of the EFM signal by the delay time specified by the first selection signal SEL1 and delays the falling edge of the EFM signal specified by the second selection signal SEL2. The laser device 55 receives the pulse width controlled EFM signal WDAT, adjusted in accordance with the media type and rotational speed, and records a recording mark on the disk 70. Thus, the recording timing of the EFM signal is adjusted in accordance with the media type and rotational speed.

(Second Embodiment)

FIG. 5 is a block diagram of a pulse width control circuit 58 according to a second embodiment of the present invention. The pulse width control circuit 58 includes the first and second delay circuits 10 and 30, the first and second selectors 11 and 31, the AND gate 12, D flip-flops (D-FF) 21 and 24, an OR gate 22, and a selection circuit 23.

The D-FF 21 receives the EFM signal and the EFM clock signal EFMCK and generates a first delayed EFM signal EFMD1 which is synchronized with the EFM clock signal EFMCK and is delayed from the EFM signal by 1T. The OR gate 22 receives the first delayed EFM signal EFMD1 and the EFM signal and outputs an OR output signal of the first delayed EFM signal EFMD1 and the EFM signal.

The selection circuit 23 has an A terminal receiving the first delayed EFM signal EFMD1 and a B terminal receiving the OR output signal. The selection circuit 23 selects either the first delayed EFM signal EFMD1 or the OR output signal in accordance with the selection signal SW and outputs a selected signal from an output terminal C. The D-FF 24 receives the selected signal and supplies a delay signal EFMD2 which is synchronized with the EFM clock signal EFMCK and is delayed from the selected signal by 1T, to the first delay circuit 10.

In the second embodiment, when the rising edge delay time Tdf is larger than the falling edge delay time Tdb, a pulse width and phase controlled EFM signal having a shorter pulse width PD than the EFM signal is generated. Conversely, when the rising edge delay time Tdf is shorter than the falling edge delay time Tdb, the pulse width and phase controlled EFM signal having a longer pulse width PD than the EFM signal is generated. The selection signal SW indicates whether the pulse width is decreased or increased (shortened or extended).

When the selection signal SW is "1" indicating decrease, the selection circuit 23 selects the first delayed EFM signal EFMD1 supplied to the A terminal. When the selection signal SW is "0" indicating increase, the selection circuit 23 selects the OR output signal supplied to the B terminal.

Figure 6:
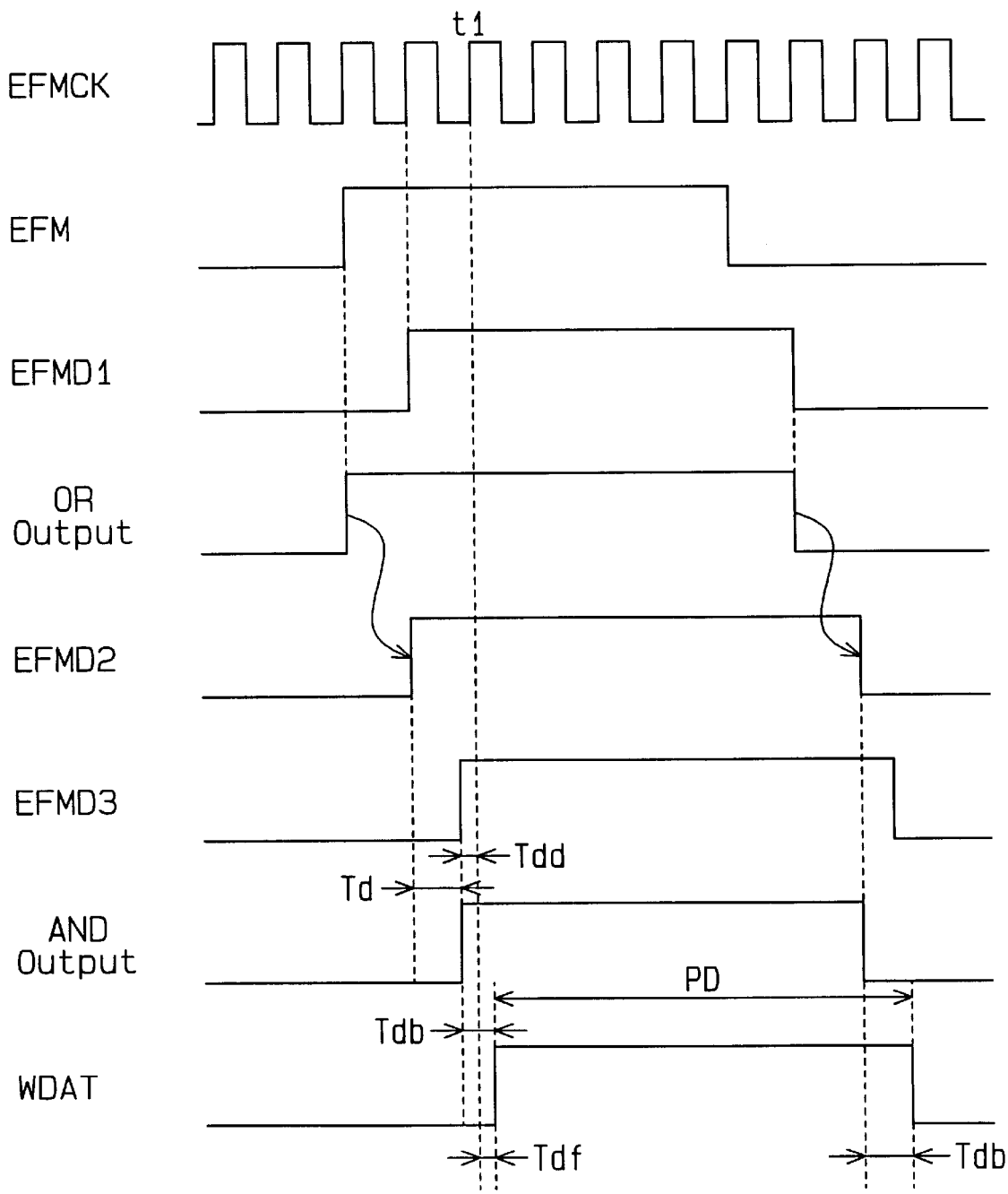
FIG. 6 is a timing chart describing the operation of the pulse width control circuit of FIG. 5.

The pulse width increasing operation of the pulse width control circuit 58 now will be described with reference to FIG. 6.

The D-FF 21 receives a 6T EFM signal (i.e., EFM signal active for 6 cycles of the clock signal EFMCK) and an EFM clock signal EFMCK and generates a first delayed EFM signal EFMD1 from the EFM signal delayed by 1T. The OR gate 22 performs the logical OR operation on the first delayed EFM signal EFMD1 and the EFM signal and generates an OR output signal having the pulse width increased from the EFM signal by 1T. The selection circuit 23 selects the OR output signal in accordance with the selection signal SW "0". The D-FF 24 receives the selected OR output signal and supplies a delayed OR output signal EFMD2, which is synchronized with the EFM clock signal EFMCK, to the first delay circuit 10. Each delay element 40 of the first delay circuit 10 delays the delayed OR output signal EFMD2 by T/16.

The first selector 11 selects one of the outputs of the delay elements 40 in accordance with the first selection signal SEL1. The first selection signal SEL1 selects the output of the delay element 40 corresponding to the delay time Td. Accordingly, a delay signal EFMD3, delayed by the delay time Td of the delayed OR output signal EFMD2, is output from the first selector 11. The delay time Td is obtained by subtracting a difference delay time Tdd (absolute value) between the rising and falling delay times Tdf, Tdb from 1T. The AND gate 12 receives the delay signal EFMD3 and the delayed OR output signal EFMD2 and generates an AND output signal having a shorter pulse width than the delayed OR output signal EFMD2 by the delay time Td. Since the signal EFMD2 has a longer pulse width than the EFM signal by 1T, the AND output signal has a longer pulse width than the EFM signal by the difference delay time Tdd.

Each delay element 40 of the second delay circuit 30 delays the AND output signal by T/16, and the second selector 31 selects one of the outputs of the delay elements 40 in accordance with the second selection signal SEL2. The second selection signal SEL2 selects the output of the delay element 40 corresponding to the delay time Tdb of the falling edge. The falling edge delay time Tdb is the sum of the difference delay time Tdd and the rising edge delay time Tdf. Accordingly, the pulse width PD of the AND output signal is not varied and only the phase thereof is shifted by the added time (Tdd+Tdf). Thus, the pulse width and phase controlled EFM signal WDAT which rises delayed by the delay time Tdf from the rise timing t1 of the EFM clock signal EFMCK and falls delayed by the delay time Tdb for the AND output signal is generated. The pulse width PD of the pulse width and phase controlled EFM signal WDAT is longer than that of the EFM signal. For example, when the 10th delay element 40 is selected by the first selection signal, the pulse width PD is increased by 6T/16 ((16−10)×T/16) from the pulse width 6T of the EFM signal. Further, when the 10th delay element 40 is selected by the second selection signal SEL2, the rising edge delay time Tdf is set to 4T/16 (Tdf=(10−6)×T/16) and the falling edge delay time Tdb is set to 10T/16.

Figure 7:
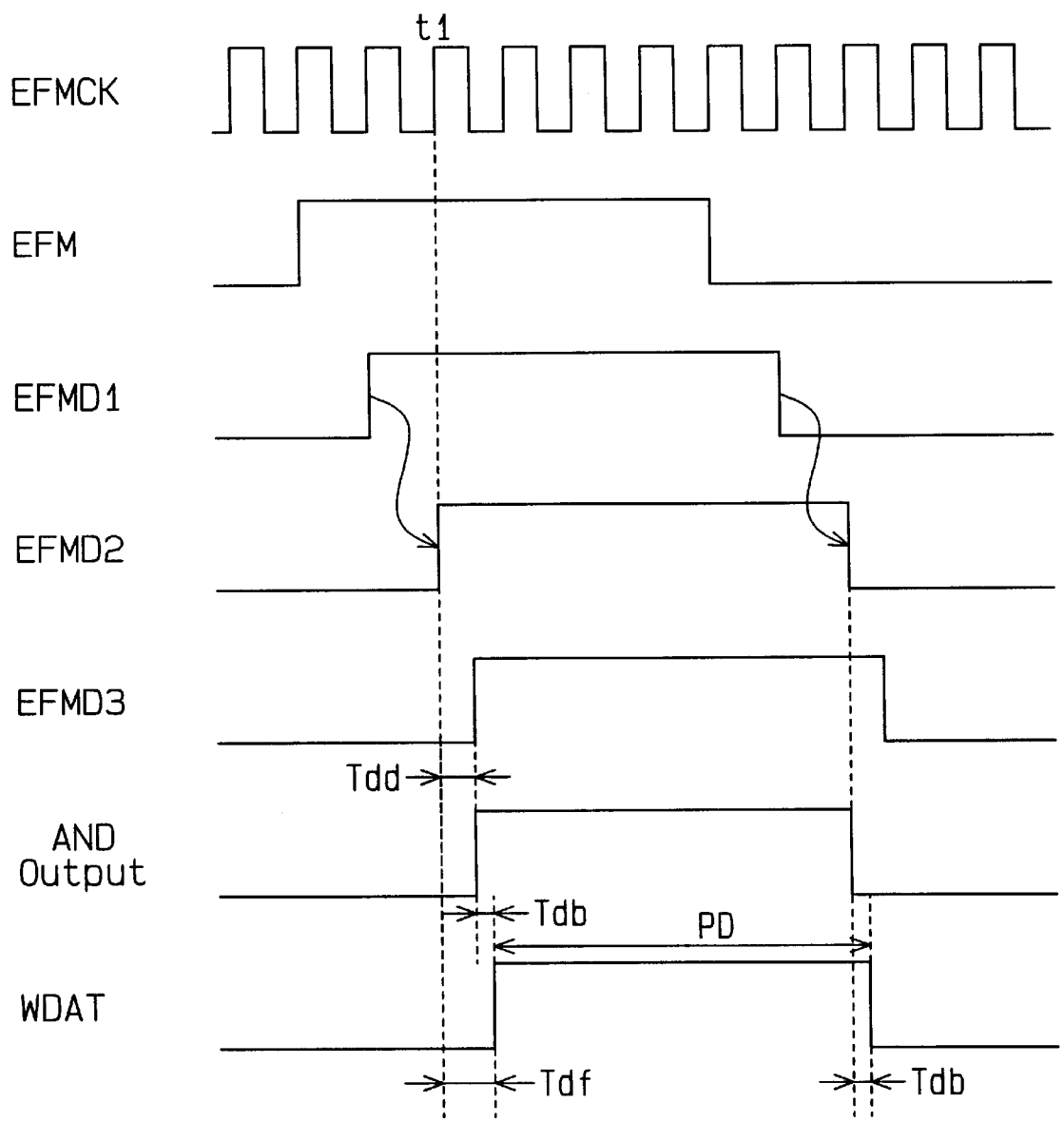
FIG. 7 is a timing chart describing the operation of the pulse width control circuit of FIG. 5.

Next, the pulse width decreasing operation of the pulse width control circuit 58 will be described with reference to FIG. 7. When decreasing the pulse width, the selection signal SW "1" is supplied to the selection circuit 23 and the first delayed EFM signal EFMD1 is selected. The first delayed EFM signal EFMD1 is supplied to the D-FF 24, and the second delayed EFM signal EFMD2, which is the first delayed EFM signal EFMD1 delayed by 1T, is supplied from the D-FF 24 to the first delay circuit 10. The first selector 11 supplies the delay signal EFMD3 which rises delayed by the delay time Tdd from the second delayed EFM signal EFMD2 in accordance with the first selection signal SEL1, to the AND gate 12. The first selection signal SEL1 selects the output of the delay element 40 corresponding to the difference delay time Tdd between the rising and falling edges delay times Tdf and Tdb. The AND gate 12 supplies an AND output signal of the delay signal EFMD3 and the second delayed EFM signal EFMD2 to the second delay circuit 30. The AND output signal has the pulse width PD which is shorter than the second delayed EFM signal EFMD2 by the delay time Tdd.

Each delay element 40 of the second delay circuit 30 delays the AND output signal by T/16, and the second selector 31 selects the output of one of the delay elements 40 in accordance with the second selection signal SEL2. The second selection signal SEL2 selects the output of the delay element 40 corresponding to the falling edge delay time Tdb. Accordingly, the pulse width PD of the AND output signal is not varied and only the phase thereof is shifted by the delay time Tdb. Thus, the pulse width and phase controlled EFM signal WDAT having a rising edge delayed by the delay time Tdf (Tdd+Tdb) from the rise timing t1 of the EFM clock signal EFMCK and a falling edge delayed by the delay time of the AND output signal, is generated. The pulse width PD of the pulse width and phase controlled EFM signal WDAT is shorter than that of the EFM signal. For example, when the 8th delay element is selected by the first selection signal SEL1, the pulse width PD is decreased by 8T/16 from the pulse width 6T of the EFM signal. Further, when the 4th delay element 40 is selected by the second selection signal SEL2, the delay time Tdf at the rising edge is set to 12T/16 ((8+4)×T/16) and the delay time Tdb at the falling edge is set to 4T/16.

As an alternative example of the second embodiment, the AND output signal of the delay signal EFMD3 and the second delayed EFM signal EFMD2 may be output from the AND gate 12 as the pulse width and phase controlled EFM signal WDAT by supplying the second delayed EFM signal EFMD2 to the second delay circuit 30 and supplying the delay signal of the second selector 31 to the first delay circuit 10.

Figure 8:
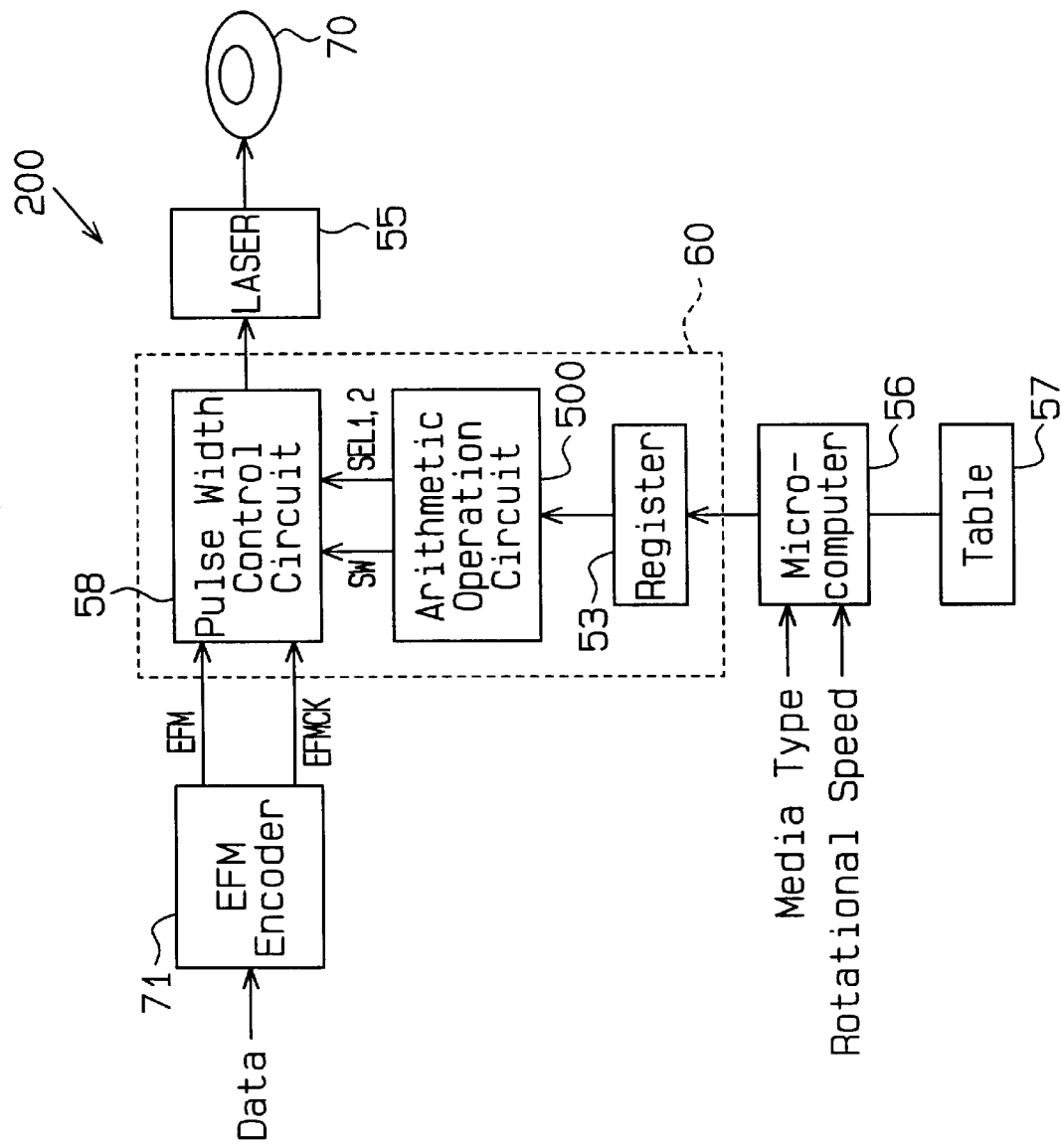
FIG. 8 is a schematic block diagram of a disk recording control circuit including the-pulse width control circuit of FIG. 5.

FIG. 8 is a schematic block diagram of a CD-R disk recording apparatus 200 including the pulse width control circuit 58. The CD-R apparatus 200 includes the EFM encoder 71, a disk recording control circuit 60, the laser device 55, the microcomputer 56, and the table 57. The disk recording control circuit 60 includes the pulse width control circuit 58, the register 53, and an arithmetic operation circuit 500.

The arithmetic operation circuit 500 calculates a difference delay time (Tdf−Tdb) using the delay times Tdf, Tdb set in the register 53. When Tdf<Tdb, the arithmetic operation circuit 500 supplies the selection signal SW "0" for increasing the pulse width and the first selection signal SEL1 for selecting the delay element 40 corresponding to delay time Td as a result of subtracting the difference delay time Tdd from 1T, to the pulse width control circuit 58. when Tdf>Tdb, the arithmetic operation circuit 500 supplies the selection signal SW "1" for decreasing the pulse width and the first selection signal SEL1 for selecting the delay element 40 corresponding to difference delay time Tdd, to the pulse width control circuit 58. The arithmetic operation circuit 500 further supplies the second selection signal SEL2 for selecting the delay element 40, corresponding to the falling edge delay time Tdb, to the pulse width control circuit 58. The pulse width control circuit 52 controls the pulse width of the EFM signal in accordance with the first selection signal SEL1 and controls the phase of the EFM signal in accordance with the second selection signal SEL2. The laser device 55 receives the pulse width and phase controlled EFM signal WDAT from the pulse width control circuit 58 and records the recording mark on the disk 70 in accordance with the media type and rotational speed.

Figure 9:
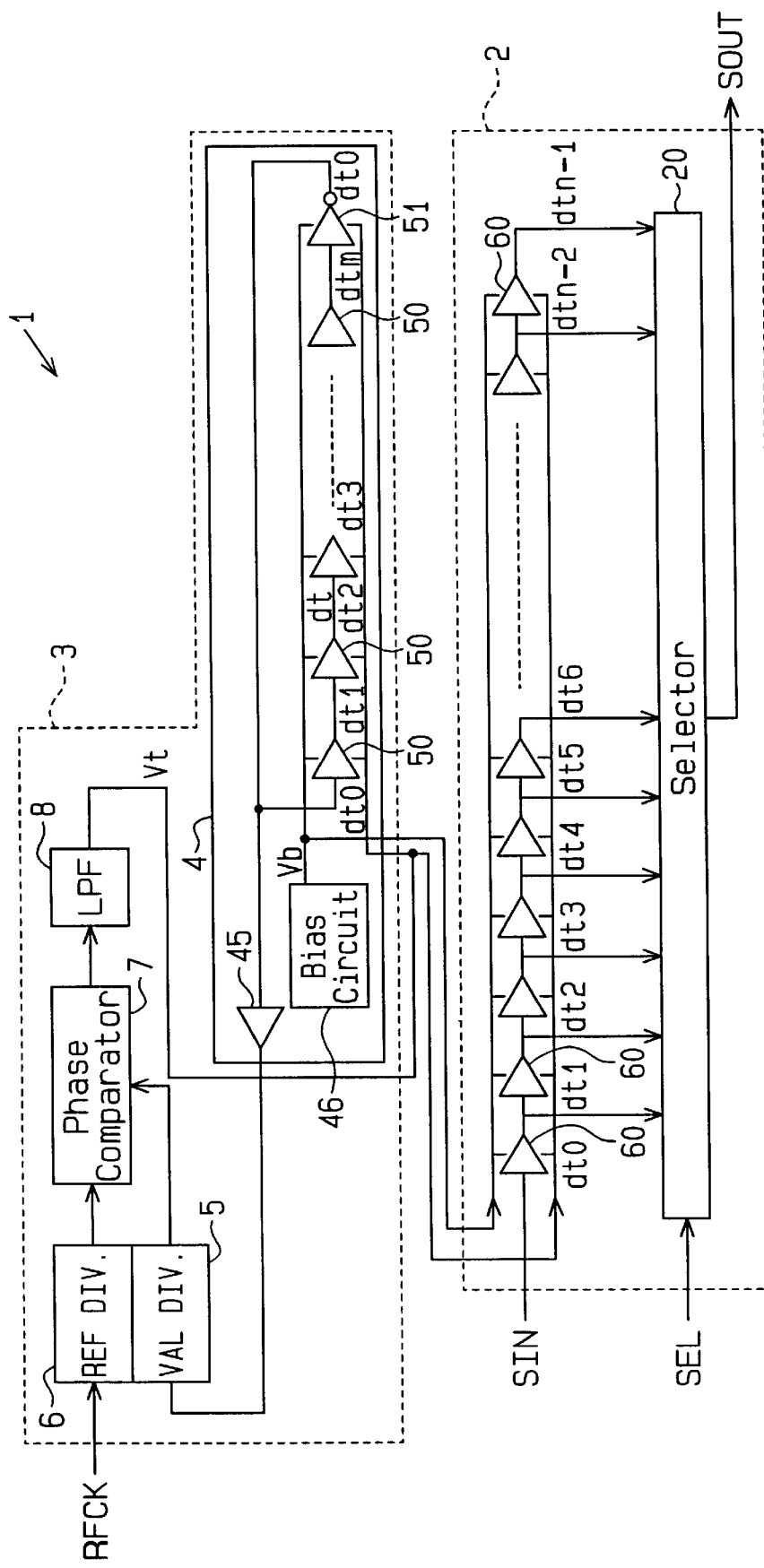
FIG. 9 is a block diagram of a delay circuit according to a third embodiment of the present invention.

The delay time of the delay elements 40 of the delay circuits 10 and 30 of FIGS. 1 and 5 is not uniform due to the unevenness of the transistor characteristics of the delay elements 40. FIG. 9 is a block diagram of a delay circuit 1 according to a third embodiment of the present invention suitable for obtaining a highly accurate and substantially uniform delay time. The delay circuit 1 includes a delay line 2 for generating a delay input signal, a PLL circuit 3 for controlling the delay time of the delay line 2, and a selector 20. The selector 20 has the same configuration as the selectors 11, 31 of FIGS. 1 and 5.

The PLL circuit 3 includes a voltage-controlled oscillator (VCO) 4, a programmable divider 5, a reference divider 6, a phase comparator 7, and a low pass filter 8. The VCO 4 generates an oscillation output signal having a frequency that varies in accordance with a control voltage Vt. The programmable divider 5 frequency-divides the oscillation output signal of the VCO 4 into 1/N and generates a frequency-divided oscillation output signal. The reference divider 6 frequency-divides a reference signal RFCK into 1/M and generates a frequency-divided reference signal. The phase comparator 7 compares the phase of the frequency-divided oscillation output signal and the phase of the frequency-divided reference signal and generates a phase difference detection signal. The low pass filter 8 supplies the control voltage Vt according to the phase difference detection signal to the VCO 4. The frequency division ratio of the programmable divider 5 and the reference divider 6 is changeable. A charge pump (not illustrated) is provided between the phase comparator 7 and the LPF 8.

The VCO 4 includes a plurality of delay cells 50 and 51 connected in series and has a ring-shaped configuration in which the output of the final-stage delay cell 51 is negatively fed back to the initial-stage delay cell 50. The output signal of the final-stage delay cell 51 is supplied to the programmable divider 5 via a buffer 45. The respective delay cells 50 and 51 have first and second control terminals. A predetermined bias voltage Vb is supplied from a bias circuit 46 to the first control terminal, and the control voltage Vt from the low pass filter 8 is supplied to the second control terminal.

The delay line 2 includes a plurality of delay cells 60 connected in series. Each delay cell 60 has the same configuration as the delay cell 50. The first-stage delay cell 60 receives an input signal SIN supplied from an external device (not illustrated). The selector 20 selects any one of the delay output signals from a plural of the delay cells 60 and outputs a delay signal SOUT. The delay cells 50 and 51 of the VCO 4 and the delay cells 60 of the delay line 2 are arranged to be in close proximity. The delay characteristics of the delay cells 50, 51, and 60 are substantially the same.

Figure 10:
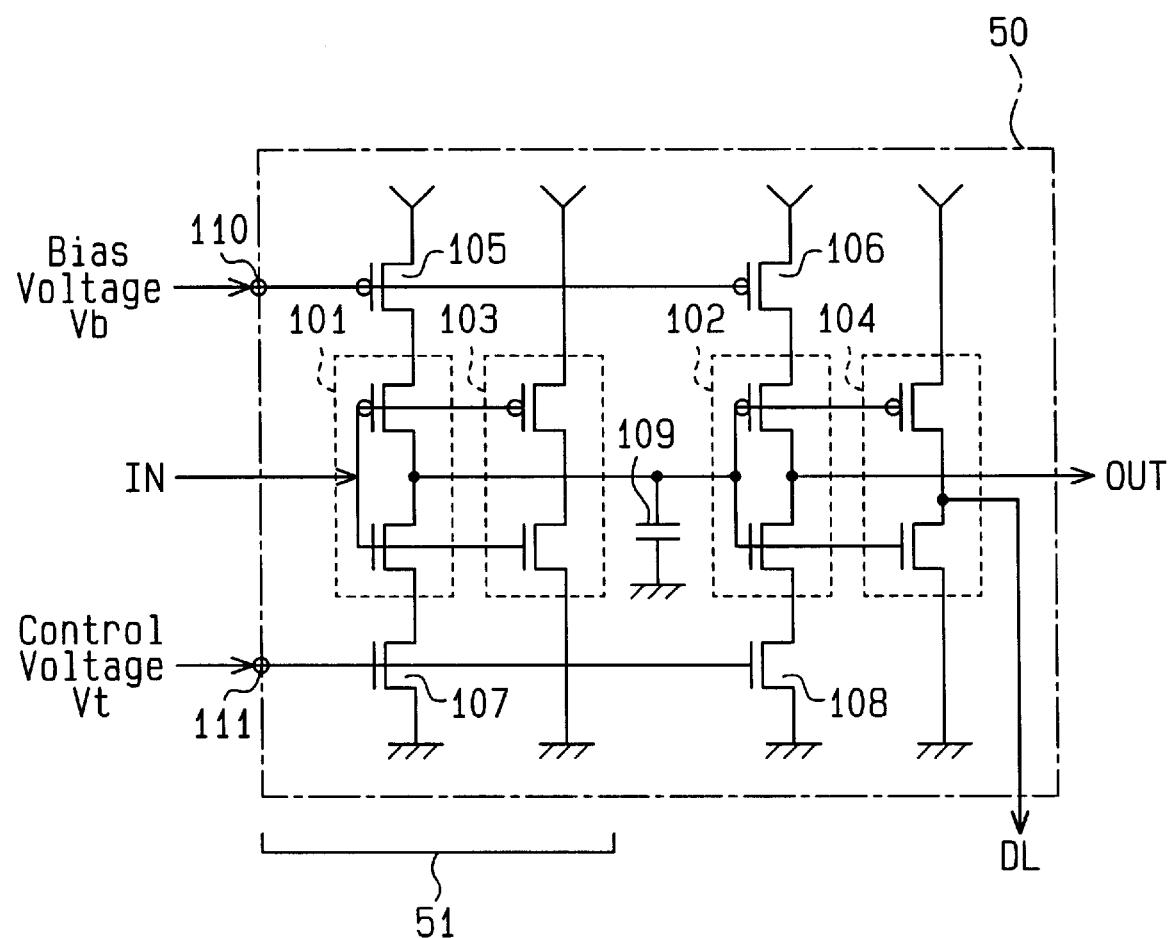
FIG. 10 is a circuit diagram of a delay cell of the delay circuit of FIG. 9.

FIG. 10 is a circuit diagram of the delay cell 50. The delay cell 50 includes first and second inverters 101 and 102 connected in series and first and second buffers 103 and 104 connected to the first and second inverters 101 and 102, respectively. Each of the first and second inverters 101 and 102 includes a P-channel MOS transistor and an N-channel MOS transistor that are connected in series. Current-controlled P-channel MOS transistors 105 and 106 are connected between a power potential and the first and second inverters 101 and 102, respectively. Current-controlled N-channel MOS transistors 107 and 108 are connected between a ground potential and the first and second inverters 101 and 102, respectively. The gate of the current-controlled N-channel MOS transistor 105 is connected to a first control terminal 110, and the gate of the current-controlled N-channel MOS transistor 107 is connected to a second control terminal 111. A parasitic capacitor 109 is connected between the ground potential and a node between the first and second inverters 101 and 102.

The predetermined bias voltage Vb from the bias circuit 46 is applied to the first control terminal 110, and the control voltage Vt from the low pass filter 8 is applied to the second control terminal 111. When the control voltage Vt increases, the current flowing in the inverters 101 and 102 increases and a delay time dt of an input signal IN decreases. When the control voltage Vt decreases, the current flowing in the first and second inverters 101 and 102 decreases and the delay time dt of the input signal IN increases. The delay time dt of the delay cell 50 varies in accordance with the control voltage Vt.

The final-stage delay cell 51 includes only the first inverter 101, the first buffer 103, and the current-controlled P-channel and N-channel MOS transistors 105 and 107. Accordingly, the output signal of the first inverter 101 of the final-stage delay cell 51 is fed back to the input of the first inverter 101 of the first-stage delay cell 50.

Next, the operation of the delay circuit 1 will be described. A frequency f1 of the oscillation output signal of the VCO 4 is frequency-divided into f1/N by the programmable divider 5, and a frequency f0 of the reference signal is frequency-divided into f0/M by the reference divider 6. The phases of two frequency division signals are compared by the phase comparator 7, and the control voltage Vt according to the phase difference is supplied from the low pass filter 8 to the VCO 4. The PLL circuit 3 operates such that the phase difference of the frequency division signals from the dividers 5 and 6 disappears. When the PLL circuit 3 is locked, the following equation (1) is established.

$$f1/N = f0/M \tag{1}$$

Figure 11:
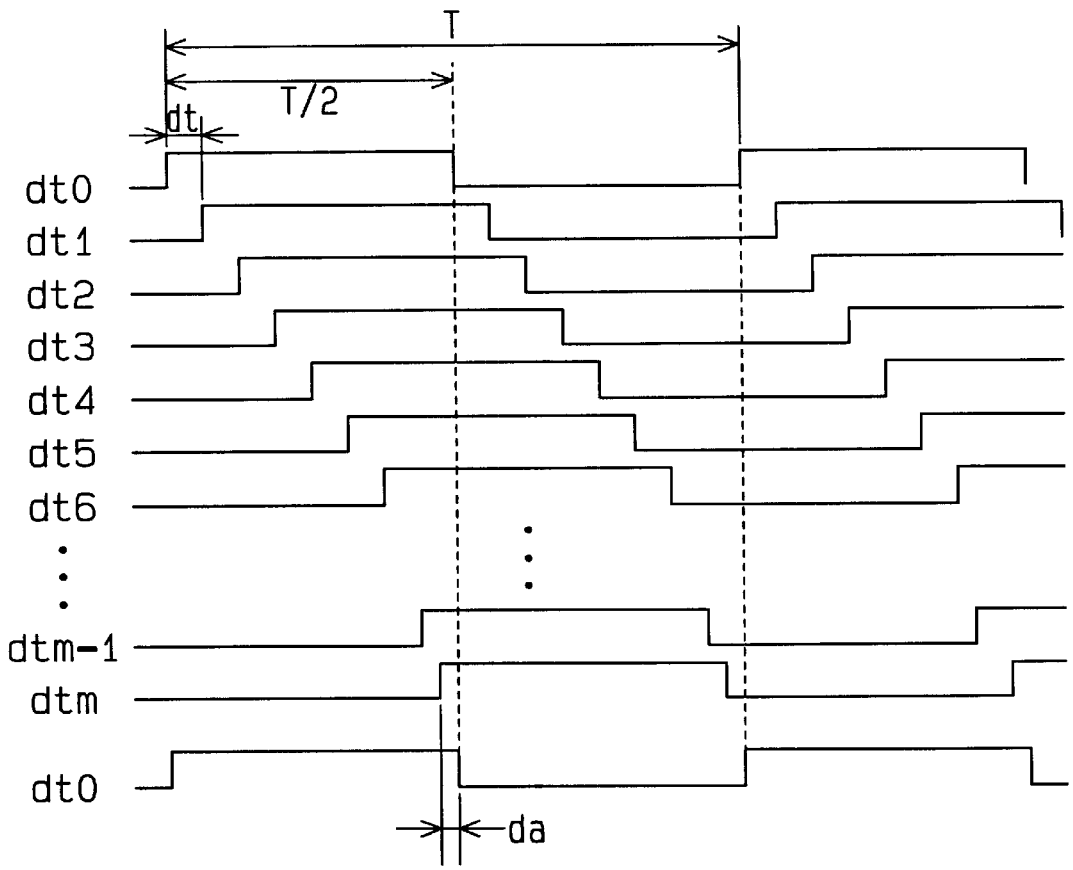
FIG. 11 is a timing chart describing a VCO operation of the delay circuit of FIG. 9.

The delay time dt of each delay cell 50 is determined in accordance with the control voltage Vt. As shown in FIG. 11, a signal dt0 supplied to the initial-stage delay cell 50 is delayed by the delay time dt while it is passing through each latter-stage delay cell 50. The output signal of the initial-stage delay cell 50 is reversed by the final-stage delay cell 51, and the resulting inverse signal is delayed by loopback delay d and fed back to the first-stage delay cell 50. When the loopback delay d is far smaller than the delay time dt, the delay time dt is represented by the following equation (2).

$$T/2 = dt \cdot D \qquad (2)$$

That is, the value obtained by adding the delay time dt by the number of stages D of the delay cells 50 is substantially equal to the semi-cycle T/2 of the VCO 4 cycle T.

When the PLL circuit 3 is locked, the delay time dt is represented by the following equation (3) based on the cycle T=1/f1 and the aforementioned equation (1).

$$dt = (M/N) \cdot (1/2D \cdot f0) \qquad (3)$$

When the number of stages D of the delay cells 50 and 51 and the frequency division ratios M and N are determined, the delay time dt of the delay cells 50 is set to a constant value that depends on only the frequency f0 of the reference signal RFCK.

The delay cell 60 of the delay line 2 has the same configuration as the delay cell 50 of the VCO 4, and the same control voltage Vt is supplied to the delay cells 50 and 60. Accordingly, the delay time of the delay cells 50 and 60 is substantially the same.

The input signal SIN is sequentially delayed by the delay cell 60, and the single delay output SOUT is selected using the selector 20. When the PLL circuit 3 is locked, the delay time dt of each delay cell 60 is set to a constant value so that a delay signal delayed by a constant delay time is output from the selector 20. This eliminates the need for adjusting the delay line 2 during manufacture and allows the delay time to be set with the guaranteed accuracy of the PLL circuit 3. As a result, a highly accurate delay time is set in psec order. Moreover, the PLL circuit 3 is also hardly affected by power fluctuation and temperature fluctuation, and so the delay time of the delay line 2 is also hardly affected by these fluctuations.

The delay time dt is easily changed in accordance with the frequency f0 of the reference signal RFCK and the frequency division ratios M and N. This facilitates the setting of the resolution of the delay line 2. For example, when the number of stages D of the delay cell 50 is set to "16", each of the frequency division ratios M and N is set to "2", and F0 is set to "17.28 MHZ", then the delay time dt "1.81 nsec" is obtained from the aforementioned equation (3). When each frequency division ratio is set to "4" and F0 is set to "34.56 MHZ", the delay time dt "0.90 nsec" is obtained. In this case, the resolution of the delay line 2 is in psec order.

Figure 12A:
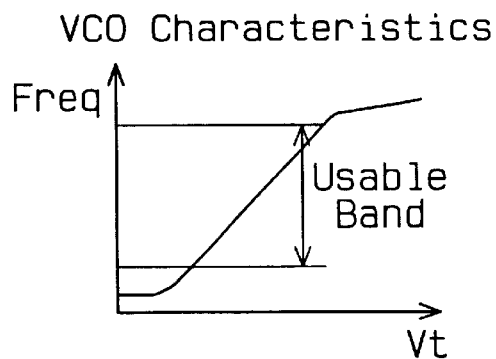
FIG. 12(*a*) is a graph showing VCO characteristics and FIG. 12(*b*) is a graph showing delay characteristics of the delay circuit.
Figure 12B:
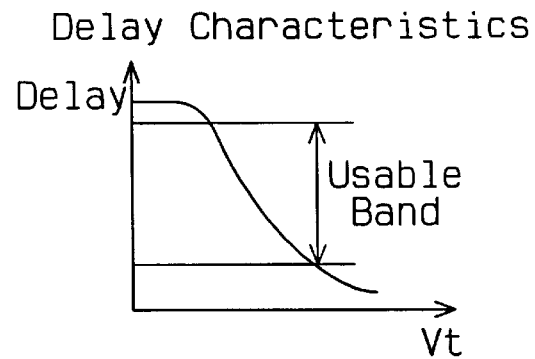

FIG. 12(*a*) is a graph showing characteristics of the VCO 4, and FIG. 12(*b*) is a graph showing delay characteristics. The frequency range in which the PLL 3 is locked is relatively wide, and the delay time dt of the delay cells can be set within the frequency range. Accordingly, the delay time setting range of the delay line 2 is wide.

It should be apparent to those skilled in the art that the present invention may be embodied in many other specific forms without departing from the spirit or scope of the invention. Particularly, it should be understood that the invention may be embodied in the following forms.

Comparators may be used instead of the inverters 101 and 102 of the delay cells 50, 51, and 60. Further, the control voltage Vt from the low pass filter 8 may be supplied to the current-controlled transistors 105 to 108.

Therefore, the present examples and embodiments are to be considered illustrative and not restrictive and the invention is not to be limited to the details given herein, but may be modified within the scope and equivalence of the appended claims.

What is claimed is:

1. A pulse width control circuit, comprising:
   a first delay circuit including a plurality of first delay elements for delaying a pulse signal and generating a plurality of first delay pulse signals;
   a first selector, connected to the plurality of first delay elements, for selecting one of the plurality of first delay pulse signals;
   a first logic circuit, connected to the first selector, for receiving the selected first delay pulse signal and the pulse signal and generating a first logic output signal;
   a second delay circuit including a plurality of second delay elements for delaying the first logic output signal and generating a plurality of delay logic signal;
   a second selector, connected to the plurality of second delay elements, for selecting one of the plurality of delay logic signals; and
   a second logic circuit, connected to the second selector and the first logic circuit, for receiving the selected delay logic signal and the first logic output signal and generating a second logic output signal, wherein the first and second logic circuits include a logic AND circuit and a logic OR circuit, wherein each of the first and second delay circuits include:
      a voltage controlled oscillator (VCO) including a plurality of third delay elements connected in a ring shape and generating an oscillation output signal according to a control voltage;
      a phase comparator for receiving a reference signal and one of the oscillation output signal and a frequency-divided oscillation output signal, comparing the phase of the reference signal and the phase of one of the oscillation output signal and the frequency-divided oscillation output signal, and generating a comparison signal indicating a phase difference therebetween; and
      a low pass filter for receiving the comparison signal and generating the control voltage, wherein the first to third delay elements set thier own delay times in accordance with the control voltage.

2. The control circuit of claim 1, wherein each of the first and second delay elements is an inverter.

3. The control circuit of claim 1, wherein each of the first and second delay elements is a comparator.

4. The control circuit of claim 1, the first to third delay elements are same configuration.

5. A disk recording circuit, comprising:
   a pulse width control circuit for receiving a pulse modulation signal and generating a pulse width controlled modulation signal in accordance with first and second selection signals related to a media type and/or a rotational speed of a recoding medium, the pulse width control circuit including,
      a first delay circuit including a plurality of first delay elements for delaying the pulse modulation signal and generating a plurality of delayed pulse modulation signals,
      a first selector, connected to the plurality of first delay elements, for selecting one of the plurality of delayed pulse modulation signals in accordance with the first selection signal,
      a first logic circuit, connected to the first selector, for receiving the selected delayed pulse modulation signal and the pulse modulation signal and generating a logic output signal,
      a second delay circuit including a plurality of second delay elements for delaying the logic output signal and generating a plurality of delayed logic signals, a second selector, connected to the plurality of second delay elements, for selecting one of the plurality of delayed logic signals in accordance with the second selection signal, and a second logic circuit, connected to the second selector and the first logic circuit, for receiving the selected delayed logic signal and the logic output signal and generating the pulse width controlled modulation signal, wherein the first and second logic circuits include a logic AND circuit and a logic OR circuit, wherein each of the first and second delay circuits includes:

a voltage controlled oscillator (VCO) including a plurality of third delay elements connected to a ring shape and generating an oscillating output signal according to a control voltage;

a phase comparator for receiving a reference signal and one of the oscillation output signal and a frequency-divided oscillation output signal, comparing the phase of the reference signal and the phase of one of the oscillation output signal and the frequency-divided oscillation output signal, and generating a comparison signal indicating a phase difference therebetween; and a low pass filter for receiving the comparison signal and generating the control voltage, wherein the first to third delay elements set their own delay times in accordance with the control voltage.

6. The control circuit of claim 5, wherein each of the first and second delay elements is a inverter.

7. The control circuit of claim 5, wherein each of the first and second delay elements is a comparator.

8. The control circuit of claim 5, the first to third delay elements are same configuration.

9. A pulse width control circuit, comprising:

a synchronous circuit for receiving a pulse signal and generating a delayed pulse signal which is synchronized with a reference clock signal and is delayed by a predetermined period;

a first logic circuit, connected to the synchronous circuit, for receiving the delayed pulse signal and the pulse signal and generating a first logic operation pulse signal;

a selection circuit, connected to the synchronous circuit and the first logic circuit, for receiving the delayed pulse signal and the first logic operation pulse signal and selecting one of the delayed pulse signal and the first logic operation pulse signal in accordance with information indicating a decrease or increase of the pulse width;

a first delay circuit including a plurality of first delay elements for delaying the selected pulse signal and generating a plurality of first delayed pulse signals;

a first selector, connected to the plurality of first delay elements, for selecting one of the plurality of first delayed pulse signals;

a second logic circuit, connected to the first selector, for receiving the selected first delayed pulse signal and the selected one of delayed pulse signal and the first logic operation pulse signal from the selection circuit and generating a second logic operation pulse signal;

a second delay circuit including a plurality of second delay elements for delaying the second logic operation pulse signal and generating a plurality of delayed logic signals; and a second selector, connected to the plurality of second delay elements, for selecting one of the plurality of delayed logic signals and generating a pulse width controlled pulse signal.

10. The pulse width control circuit of claim 9, wherein the first selector selects one of the plurality of first delayed pulse signals in accordance with a first selection signal which selects the delay pulse signal of the first delay element corresponding to one of the difference delay time of the rising edge and the falling edge of the pulse width controlled pulse signal and the delay times obtained by subtracting the difference delay time from the predetermined period, and the second selector selects one of the plurality of delayed logic signals in accordance with the second selection signal which selects the delayed logic signal of the second delay element corresponding to the delay time of the falling edge of the pulse width controlled pulse signal.

11. The pulse width control circuit of claim 9, wherein each of the first and second delay circuits includes:

a voltage controlled oscillator (VCO) including a plurality of third delay elements connected in a ring shape and generating an oscillation output signal according to a control voltage;

a phase comparator for receiving a reference signal and one of the oscillation output signal and a frequency-divided signal of the oscillation output signal, comparing the phase of the reference signal and the phase of one of the oscillation output signal and the frequency-divided oscillation output signal, and generating a comparison signal indicating the phase difference therebetween; and a low pass filter for receiving the comparison signal and generating the control voltage, wherein the first to third delay elements set their own delay times in accordance with the control voltage.

12. The pulse width control circuit of claim 11, the first to third delay elements are same configuration.

13. A pulse width control circuit, comprising:

a synchronous circuit for receiving a pulse signal and generating a delayed pulse signal which is synchronized with a reference clock signal and is delayed by a predetermined period;

a first logic circuit, connected to the synchronous circuit, for receiving the delayed pulse signal and the pulse signal and generating a logic operation pulse signal;

a selection circuit, connected to the synchronous circuit and the first logic circuit, for receiving the delayed pulse signal and the logic operation pulse signal and selecting one of the delayed pulse signal and the logic operation pulse signal in accordance with information indicating a decrease or increase of the pulse width;

a first delay circuit including a plurality of first delay elements for delaying the selected pulse signal and generating a plurality of first delayed pulse signals;

a first selector, connected to the plurality of first delay elements, for selecting one of the plurality of first delayed pulse signals;

a second delay circuit including a plurality of second delay elements for delaying the selected first delayed pulse signal and generating a plurality of second delayed pulse signals;

a second selector, connected to the plurality of second delay elements, for selecting one of the plurality of second delayed pulse signals; and a second logic circuit, connected to the second selector, for receiving the selected second delayed pulse signal and the selected one of the delayed pulse signal and the logic operation pulse signal from the selection circuit and generating a pulse width controlled pulse signal.

14. The pulse width control circuit of claim 13, wherein the first selector selects one of the plurality of first delayed pulse signals in accordance with a first selection signal which selects the delay pulse signal of the first delay element corresponding to one of the difference delay time of the rising edge and the falling edge of the pulse width controlled pulse signal and the delay times obtained by subtracting the difference delay time from the predetermined period, and the second selector selects one of the plurality of second delayed pulse signals in accordance with a second selection signal which selects the delayed logic signal of the second delay element corresponding to the delay time of the falling edge of the pulse width controlled pulse signal.

15. The pulse width control circuit of claim 13, where in each of the first and second delay circuits includes:

a voltage controlled oscillator (VCO) including a plurality of third delay elements connected in a ring shape and generating an oscillation output signal according to a control voltage;

a phase comparator for receiving a reference signal and one of the oscillation output signal and a frequency-divided signal of the oscillation output signal, comparing the phase of the reference signal and the phase of one of the oscillation output signal and the frequency-divided oscillation output signal, and generating the comparison signal indicating the phase difference therebetween; and a low pass filter for receiving the comparison signal and generating the control voltage, wherein the first to third delay elements set their own delay times in accordance with the control voltage.

16. The pulse width control circuit of claim 15, the first to third delay elements are same configuration.

17. A disk recording control circuit, comprising:

a pulse width control circuit for receiving a pulse modulation signal and generating a pulse width controlled modulation signal in accordance with first and second selection signals related to a media type and/or a rotational speed of a recording medium, the pulse width control circuit including, a synchronous circuit for receiving the pulse modulation signal and generating a delayed pulse modulation signal which is synchronized with a reference clock signal and is delayed by a predetermined period, a first logic circuit, connected to the synchronous circuit, for receiving the delayed pulse modulation signal and the pulse modulation signal and generating a first logic operation pulse modulation signal, a selection circuit, connected to the synchronous circuit and the first logic circuit, for receiving the delayed pulse modulation signal and the first logic operation pulse modulation signal and selecting one of the delayed pulse modulation signal and the first logic operation pulse modulation signal in accordance with information indicating a decrease or increase of the pulse width, a first delay circuit including a plurality of first delay elements for delaying the selected pulse modulation signal and generating a plurality of first delayed pulse modulation signals, a first selector, connected to the plurality of first delay elements, for selecting one of the plurality of first delayed pulse modulation signals in accordance with a first selection signal, a second logic circuit, connected to the first selector, for receiving the selected first delayed pulse modulation signal and the selected one of the delayed pulse modulation signal and the first logic operation pulse modulation signal from the selection circuit and generating a second logic operation pulse modulation signal, a second delay circuit including a plurality of second delay elements for delaying the second logic operation pulse modulation signal and generating a plurality of delayed logic signals, and a second selector, connected to the plurality of second delay elements, for selecting one of the plurality of delayed logic signals in accordance with a second selection signal and generating the pulse width controlled pulse modulation signal.

18. A disk recording control circuit, comprising:

a pulse width control circuit for receiving a pulse modulation signal and generating a pulse width controlled modulation signal in accordance with first and second selection signals related to a media type and/or a rotational speed of a recording medium, the pulse width control circuit including, a synchronous circuit for receiving the pulse modulation signal and generating a delayed pulse modulation signal which is synchronized with a reference clock signal and is delayed by a predetermined period, a first logic circuit, connected to the synchronous circuit, for receiving the delayed pulse modulation signal and the pulse modulation signal and generating a logic operation pulse modulation signal, a selection circuit, connected to the synchronous circuit and the first logic circuit, for receiving the delayed pulse modulation signal and the logic operation pulse modulation signal and selecting one of the delayed pulse modulation signal and the logic operation pulse modulation signal in accordance with information indicating a decrease or increase of the pulse width, a first delay circuit including a plurality of first delay elements for delaying the selected pulse modulation signal and generating a plurality of first delayed pulse modulation signals, a first selector, connected to the plurality of first delay elements, for selecting one of the plurality of first delayed pulse modulation signals, a second delay circuit including a plurality of second delay elements for delaying the selected first delayed pulse modulation signal and generating a plurality of second delayed pulse modulation signals, a second selector, connected to the plurality of second delay elements, for selecting one of the plurality of second delayed pulse modulation signals, and a second logic circuit, connected to the second selector, for receiving the selected second delayed pulse modulation signal and the selected one of the delayed pulse modulation signal and the logic operation pulse modulation signal from the selection circuit and generating the pulse width controlled pulse modulation signal.

* * * * *